United States Patent
Sakamoto et al.

(10) Patent No.: US 6,489,637 B1
(45) Date of Patent: Dec. 3, 2002

(54) HYBRID INTEGRATED CIRCUIT DEVICE

(75) Inventors: Noriaki Sakamoto, Gunma (JP); Hisashi Shimizu, Gunma (JP); Susumu Ota, Gunma (JP); Yoshiyuki Kobayashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/536,730

(22) Filed: Mar. 28, 2000

(30) Foreign Application Priority Data

Jun. 9, 1999 (JP) .......................................... 11-162508
Jul. 29, 1999 (JP) .......................................... 11-215259

(51) Int. Cl.$^7$ ............................................. H01L 33/00
(52) U.S. Cl. .......................... 257/98; 257/98; 257/100; 257/88
(58) Field of Search .............................. 257/79, 88, 91, 257/98, 99, 100

(56) References Cited

U.S. PATENT DOCUMENTS

| | | | |
|---|---|---|---|
| 4,298,869 A | * 11/1981 | Okuno | 340/782 |
| 5,250,819 A | * 10/1993 | Kawasaki et al. | 257/88 |
| 5,291,038 A | * 3/1994 | Hanamotot et al. | 257/82 |
| 5,298,768 A | * 3/1994 | Okazaki et al. | 257/81 |
| 5,936,264 A | * 8/1999 | Ishinaga | 257/99 |
| 6,054,716 A | * 4/2000 | Sonobe et al. | 250/552 |
| 6,219,074 B1 | * 4/2001 | Chosa et al. | 257/100 |
| 2001/0002049 A1 | * 5/2001 | Reech et al. | 257/103 |

FOREIGN PATENT DOCUMENTS

| | | | | |
|---|---|---|---|---|
| JP | 402298084 A | * 12/1990 | | 29/827 |
| JP | 405145121 A | * 6/1993 | | 257/99 |
| JP | 405347435 A | * 12/1993 | | 257/99 |
| JP | 406090026 A | * 3/1994 | | 257/99 |

* cited by examiner

*Primary Examiner*—Eddie Lee
*Assistant Examiner*—Paul E Brock, II
(74) *Attorney, Agent, or Firm*—Fish & Richardson P.C.

(57) ABSTRACT

In a light irradiation device in which a light emitting element is attached to a printed circuit board, the heat radiation properties are enhanced, and improvement of the light emitting efficiency and reduction of the size and weight are realized. A Cu pattern covered with Ni is formed on a metal substrate 11. Light emitting elements 11 are mounted on the pattern in the form of a series circuit. Metal substrates in each of which the series connection is formed are connected to one another in parallel. Since Ni has excellent corrosion resistance and a high reflection efficiency, the surfaces of the substrates themselves can be used as reflective plates. A lens 37 is formed for each of the light emitting elements, whereby the emission efficiency can be further improved.

Flow-stopping means 36 made of a brazing material is formed around each of the light emitting diodes 10. Also the surface of the brazing material is used as a reflecting surface.

15 Claims, 14 Drawing Sheets

FIG. 12

| EREMENT NO. | NO LENS | ONE STAGE OF LENS | INCREASING RATE (%) | TWO STAGES OF LENSES | INCREASING RATE (%) | THREE STAGES OF LENSES | INCREASING RATE (%) |
|---|---|---|---|---|---|---|---|
| 1 | 2.08 | 3.71 | 178 | 3.77 | 181 | 4.12 | 198 |
| 2 | 2.21 | 4.01 | 181 | 4.13 | 187 | 4.51 | 204 |
| 3 | 2.18 | 3.85 | 177 | 3.96 | 182 | 4.43 | 203 |
| 4 | 2.12 | 3.84 | 181 | 3.94 | 186 | 4.40 | 208 |
| 5 | 2.41 | 4.33 | 180 | 4.50 | 187 | 5.07 | 210 |
| 6 | 2.34 | 4.23 | 181 | 4.34 | 185 | 4.86 | 208 |
| AVERAGE | 2.22 | 4.00 | 180 | 4.11 | 185 | 4.57 | 205 |

HYBRID INTEGRATED CIRCUIT DEVICE

BACKGROUND OF THE INVENTION

1. Field of the Invention

The present invention relates to a hybrid integrated circuit device, and more particularly to a light irradiation device in which a plurality of light emitting elements are mounted.

2. Description of the Related Art

When a plant such as a flower or a vegetable is to be irradiated with a large amount of light, a device such as an electric lamp is usually used. In some cases, in order to reduce the size and weight of the device and the power consumption, a device in which light emitting elements 2 are mounted on a printed circuit board 1 as shown in FIG. 15 is used.

As the light emitting elements, light emitting diodes which are configured by semiconductor materials are mainly used. Alternatively, semiconductor lasers or the like may be used.

In each of the light emitting diode chips 2, two leads 3 and 4 are used. The rear face (anode or cathode) of the light emitting diode chip 2 is fixed to the lead 3 by soldering or the like. The other lead 4 is electrically connected via a thin metal wire 6 to an electrode (cathode or anode) on the surface of the chip. A transparent resin sealing member 7 which will serve as a lens is formed to seal the leads 3 and 4, a bare diode 5, and the thin metal wire 6.

On the other hand, electrodes 8 and 9 for supplying a power to the light emitting diode 2 are disposed on the printed circuit board 1. The leads are inserted into through holes opened in the electrodes. The light emitting diode 2 is mounted on the board via solder or the like.

A light irradiation device using such light emitting diodes is described in, for example, JP-A-9-252651.

As described above, the light emitting element 2 is configured by a package into which the resin sealing member 7, the leads 3 and 4, and the like are incorporated. When a large number of light emitting elements are mounted, therefore, there arise problems such as that the circuit board 1 is large in size and weight. Since the heat radiation properties of the circuit board itself are inferior, the circuit board has a problem in that the temperature of the whole device is excessively raised. Consequently, the temperatures of semiconductor chips themselves which constitute the light emitting elements are raised, thereby producing a problem in that the driving ability is lowered.

In the light emitting diode 2, light is emitted also from side and rear faces, and hence light directed toward the circuit board 1 exists. Since the circuit board 1 is configured by a printed circuit board, there is another problem in that irradiation of a high efficiency cannot be realized.

SUMMARY OF THE INVENTION

The invention has been conducted in view of the above-discussed problems, and the present invention intends to obtain a light irradiating apparatus which can obtain an efficient light.

The present invention solves the problems by disposition of first flow-stopping means which is formed to substantially surround a light emitting element, and which is made of a brazing material, and a light transmitting resin which is protrudingly formed in a region surrounded by the first flow-stopping means.

The light transmitting resin before curing is held to a protruding shape by the flow-stopping means, and then cured. Therefore, the resin exhibits also a lens function. Since the flow-stopping means is configured by a brazing material, light emitted from the light emitting element can be efficiently upward reflected by using the glossiness of the surface of the brazing material and the protruding shape of the brazing material. As a result, irradiation of a high efficiency can be realized.

A brazing material is electrically conductive. When a brazing material is formed so as to be continuous over the whole periphery, therefore, a short circuit occurs. This problem is solved by disposing second flow-stopping means which is made of an insulating material, in a portion of the brazing material, the portion overlapping with the first electrode and/or the second electrode.

The problems are solved by a configuration in which first and second electrodes made of Cu are employed, first flow-stopping means which is formed around a light emitting element, and a protruding light transmitting resin are disposed, a metal film covers the first electrode and/or said second electrode, the metal film being inferior in wettability with respect to a brazing material and superior in light reflection than the Cu, a portion of the metal film corresponding to the first electrode and/or said second electrode and in a region where the first flow-stopping means is disposed is removed away, and a brazing material is formed in the region.

With respect to solder, for example, Ni is inferior in wettability than Cu. Furthermore, Ni maintains glossiness of the surface for a long term. Solder also maintains glossiness of the surface for a long term. These properties are used in the invention. Specifically, a Cu film is formed as a lower layer, an Ni film is formed as an upper layer, and a part of the Ni film is removed away to form a Cu exposed region. When solder is formed in the exposed region, the resulting solder upward protrudes. The protruding solder surface forms a reflective plate to efficiently upward reflect light which cannot be upward reflected in the conventional art.

As seen from the above description, when a substrate mainly made of Al is employed, particularly, it is possible to realize a hybrid integrated circuit device which can attain excellent heat radiation properties, light weight, and high workability, and which has a high reflection efficiency.

Each aspect if the device described below is separately illustrative of the various embodiments of the invention and is not intended to be restrictive of the broad invention.

Namely, a first aspect of the device is a hybrid integrated circuit device comprising:

first and second electrodes formed on a substrate;

a light emitting element in which a rear face of a chip is electrically fixed to said first electrode;

connecting means for electrically connecting said second electrode to an electrode which is on a surface of said light emitting element;

first flow-stopping means which is formed to substantially surround said light emitting element, and which is made of a brazing material; and a which is protrudingly formed in a region surrounded by said first flow-stopping means.

A second aspect of the device is a hybrid integrated circuit device according to the first aspect, wherein said flow-stopping means is a ring made of an insulating resin.

A third aspect of the device is a hybrid integrated circuit device according to the first aspect, wherein the flow-stopping means comprises a first flow-stopping means made of a brazing material and a second flow-stopping means made of an insulating material is disposed in a portion of said brazing material, said portion overlapping with said first electrode and/or said second electrode.

A fourth aspect of the device is a hybrid integrated circuit device according to the third aspect, wherein the second flow-stopping means is made of epoxy resin, and the light transmitting resin is made of silicone resin.

A fifth aspect of the device is a hybrid integrated circuit device according to the first aspect, wherein the first and second electrodes are made of reflective material.

A sixth aspect of the device is a hybrid integrated circuit device according to the first aspect, wherein the first and second electrodes are made of nickel.

A seventh aspect of the device is a hybrid integrated circuit device according to the first aspect, further comprising a solder resist layer formed so as to cover the first and second electrodes.

An eighth aspect of the device is a hybrid integrated circuit device according to the first aspect, wherein said substrate is made of a metal substrate whose surface is insulative processed.

A ninth aspect of the device is a hybrid integrated circuit device according to the first aspect, wherein the device comprises:
- a wiring portion consisting of a first wiring of reflective conductive film so as to cover an whole surface of a substrate; and a second wiring facing to the first wiring through a slit;
- a light emitting element mounting region formed on a part of the wiring portion comprising the first wiring and the second wiring connected with the first and second electrodes respectively; and
- a light emitting element mounted on the first and second electrode so as to introduce a light emitted by the light emitting elements into a front direction effectively.

A tenth aspect of the device is a hybrid integrated circuit device according to the first aspect, wherein said hybrid integrated circuit device comprises:
- first and second electrodes which are insulatedly formed on a hybrid integrated circuit substrate, and which are made of Cu;
- a light emitting element in which a rear face of a chip is electrically fixed to said first electrode;
- connecting means for electrically connecting said second electrode to an electrode which is on a surface of said light emitting element;
- first flow-stopping means which is formed around said light emitting element; and
- a light transmitting resin which is protrudingly formed in a region surrounded by said first flow-stopping means,
- a metal film covers said first electrode and/or said second electrode, said metal film being inferior in wettability with respect to a brazing material and superior in light reflection than the Cu,
- a portion of said metal film corresponding to said first electrode and/or said second electrode and in a region where said first flow-stopping means is disposed is removed away, and a brazing material is formed in said region.

An eleventh aspect of the device is a hybrid integrated circuit device according to the third aspect, wherein said first electrode is formed in an annular shape to substantially surround said second electrode, and said brazing material is formed on said first electrode in a substantially annular shape.

A twelfth aspect of the device is a hybrid integrated circuit device according to the third aspect, wherein said first electrode is formed in an annular shape to substantially surround said second electrode, and said region where said brazing material is formed is formed in a substantially island-like shape in said first electrode.

A thirteenth aspect of the device is a hybrid integrated circuit device according to the third aspect, wherein said metal film is made of Ni.

A fourteenth aspect of the device is a hybrid integrated circuit device according to the first aspect, wherein a plurality of said light emitting elements are connected in series on said hybrid integrated circuit substrate.

A fifteenth aspect of the device is a hybrid integrated circuit device according to the first aspect, wherein the light transmitting resin has a two stage structure so as to introduce a light emitted by the light emitting elements into a front direction effectively.

BRIEF DESCRIPTION OF THE DRAWINGS

FIG. 12 is a view showing a relation ship between a presence of lens and a light quantity.

DESCRIPTION OF THE PREFERRED EMBODIMENTS

Embodiments of the invention will be described with reference to the accompanying drawings. Hereinafter, connection of a light emitting diode 10 will be particularly described.

Figure 2:
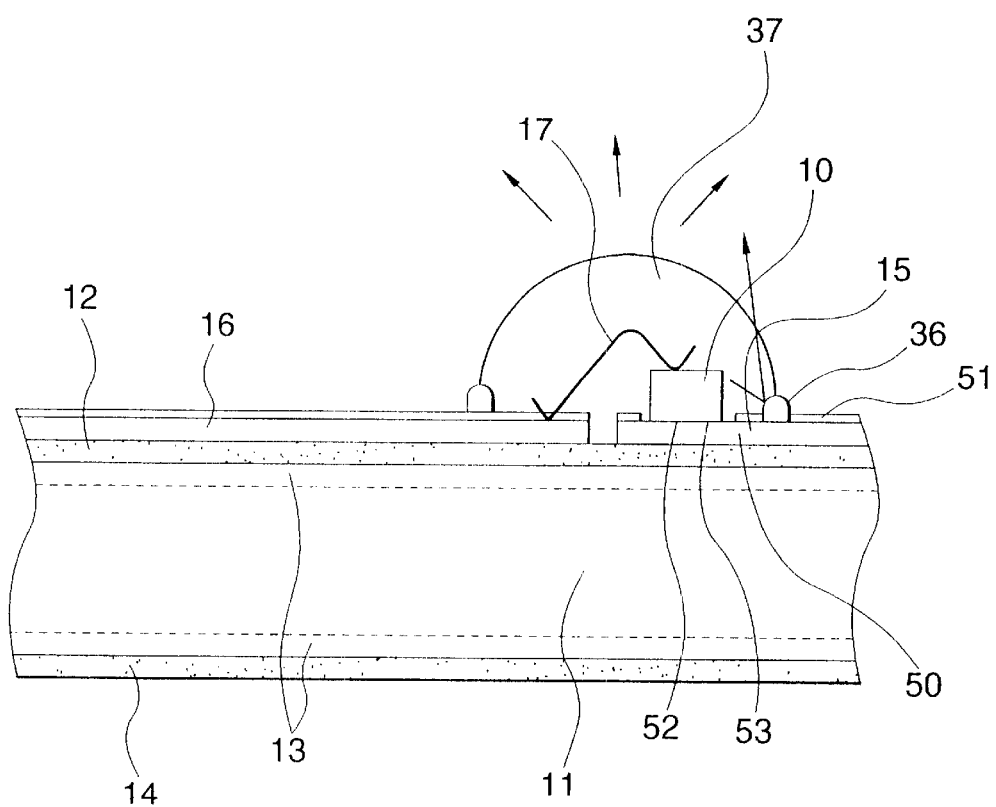
FIG. 2 is a section view taken along the line A—A of FIG. 1.
Figure 4:
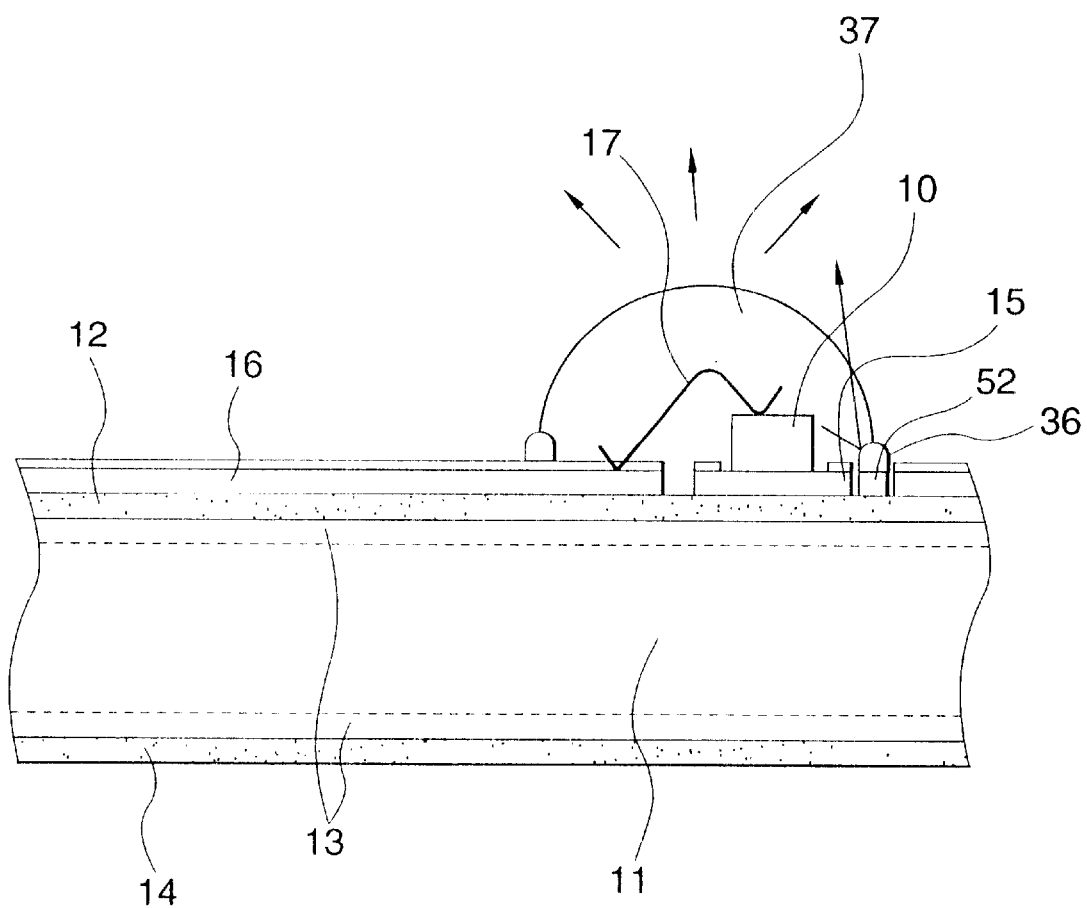
FIG. 4 is a section view taken along the line A—A of FIG. 3.

As shown in FIGS. 2 and 4, a hybrid integrated circuit substrate 11 configured by a metal member which is punched out by a pressing (cutting) work. As the material of the hybrid integrated circuit substrate 11, a metal such as Al, Cu, or Fe may be used.

In the embodiment, a metal substrate is used as the hybrid integrated circuit substrate by reasons including: that heat generated from a light emitting element can be efficiently radiated to the outside; that the temperature of the light emitting element can be prevented from being raised, thereby improving the driving ability; that the flatness of the substrate causes light emitted in a direction other than the upward one to be efficiently reflected by the substrate 11 to be upward directed; and that workability for forming screw holes for mounting, workability for forming a curved face such as a paraboloid, and other workabilities are excellent. Alternatively, a ceramic substrate or a printed circuit board may be used. However, a ceramic substrate has a low impact resistance, and a printed circuit board has low heat radiation properties.

In the invention, it is essential to configure flow-stopping means 36 by a glossy material of high reflectivity as described later. Therefore, the hybrid integrated circuit substrate may be a metal substrate, a ceramic substrate, a printed circuit board, a flexible sheet, a glass substrate, or the like, and the material is suitably selected as required.

In the invention, Al is employed in view of heat radiation properties, workability, and light weight. In this case, in order to improve the insulation properties, an oxide may be formed on the surface by anodic oxidation, and an insulative resin 12 may be formed on the oxide. The anodic oxide film may be omitted, or a film other than the film may be produced by a chemical reaction. Particularly, an anodic oxide film has a honeycomb-like shape, and pores are formed so that a thermal resistance is produced in this portion. In place of an anodic oxide film, therefore, a film of another kind may be formed. Since the surface of Al is flat, it is preferable to produce a rough face 13 mechanically or chemically in order to improve the adhesiveness between the substrate and the insulative resin.

The rear face of the Al substrate 11 is mechanically weak to be easily damaged, and has no resistance to corrosion. Therefore, the rear face may be covered with a film of an insulative resin 14 as required.

The whole face of the hybrid integrated circuit substrate 11 is covered with the insulative resin 12 in view of a short circuit with first and second electrodes 15 and 16 which are formed on the substrate. The first and second electrodes 15 and 16 are used for connecting light emitting diodes in series, and hence referred to a also as connecting electrodes.

In a process of transmitting heat generated from a light emitting diode to the metal substrate 11, the insulative resin film 12 functions as a thermal resistance material. In order to reduce the thermal resistance as far as possible, it is preferable to reduce the thickness of the film. By contrast, in view of the dielectric properties, an insulative resin which has an increased film thickness, and which is mixed with a filler such as an Si oxide film or aluminum oxide may be employed. It is a matter of course that the thermal resistance is lower in the case of aluminum oxide.

A conductive pattern includes the first and second electrodes 15 and 16, and is made of, for example, Cu foil. Wirings, a land for a chip, a pad for bonding, and, as required, a fixing pad for an external lead are patterned. A bare light emitting diode 10 is disposed on the first electrode 15. The rear face of a light emitting diode chip is configured as one of two types, or the cathode type and the anode type. In the embodiment, the rear face is configured as the anode type. When the direction of the power supply is reversed, the cathode type may be used. The electrode on the surface of the light emitting diode is connected to the second electrode 16 via a thin metal wire 17.

Figure 6:
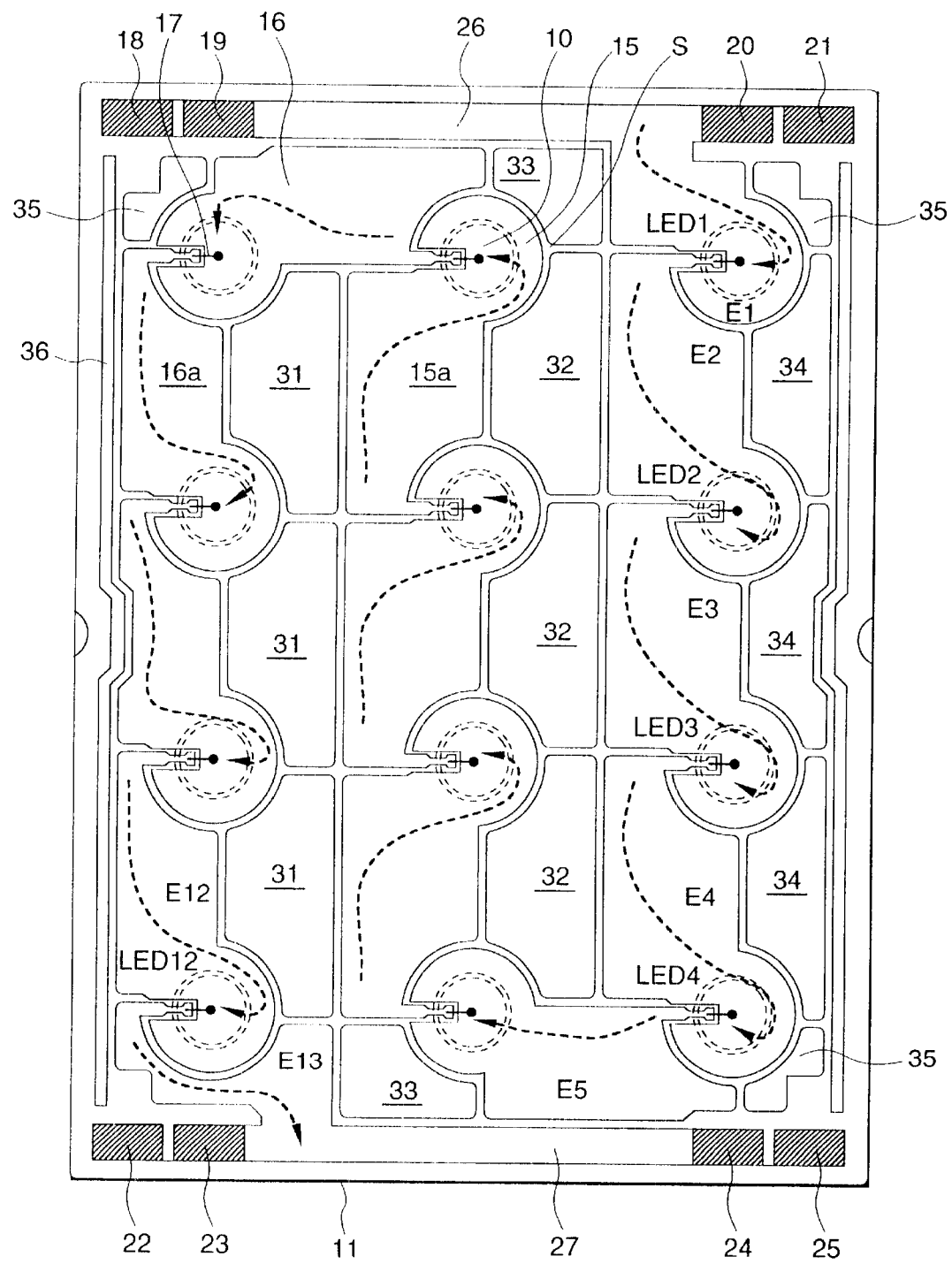
FIG. 6 is a view illustrating a hybrid integrated circuit substrate.

The invention is applied to an irradiation device for emitting a large amount of light. As shown in FIG. 6, a plurality of light emitting diodes LED1 to LED12 are connected in series between first and second wirings 26 and 27 via connection electrodes E2 to E12. Alternatively, the device may be realized by using a single light emitting diode.

In order to cause the device to function as a light irradiation device, a plurality of the light emitting diodes 10 are disposed in a scattered manner as described above. In FIG. 6, a driving circuit and/or a protection circuit for the light emitting diodes are externally disposed. Alternatively, as indicated by C in FIG. 7, such a driving circuit and/or a protection circuit may be mounted on the metal substrate 11. In the alternative, wirings, lands, bonding pads, pads for external electrical connection, and the like are patterned in the periphery of the substrate, particularly in the corners and their vicinities, and components such as chip capacitors, chip resistors, and printed resistors, transistors, diodes, and ICs are connected between the wirings, thereby realizing the circuits. Packaged elements may be mounted. However, bare chip elements are superior from the viewpoints of heat radiation properties and mounting area. These elements will be generally referred to as circuit elements.

These circuit elements are electrically fixed via, for example, a brazing material such as solder, or silver paste, and the printed resistors are formed by screen printing. In order to electrically connect the semiconductor chips to the wirings, the thin metal wires 17 are electrically connected between the electrodes on the chips and the bonding pads, and, as required, external leads are electrically connected to the pads via solder. In the case where the chips are of the BGA type or the like, the fixation may be naturally realized by face down bonding. In view of mounting, at least two screwing holes may be opened in the sides of the substrate.

Figure 5:
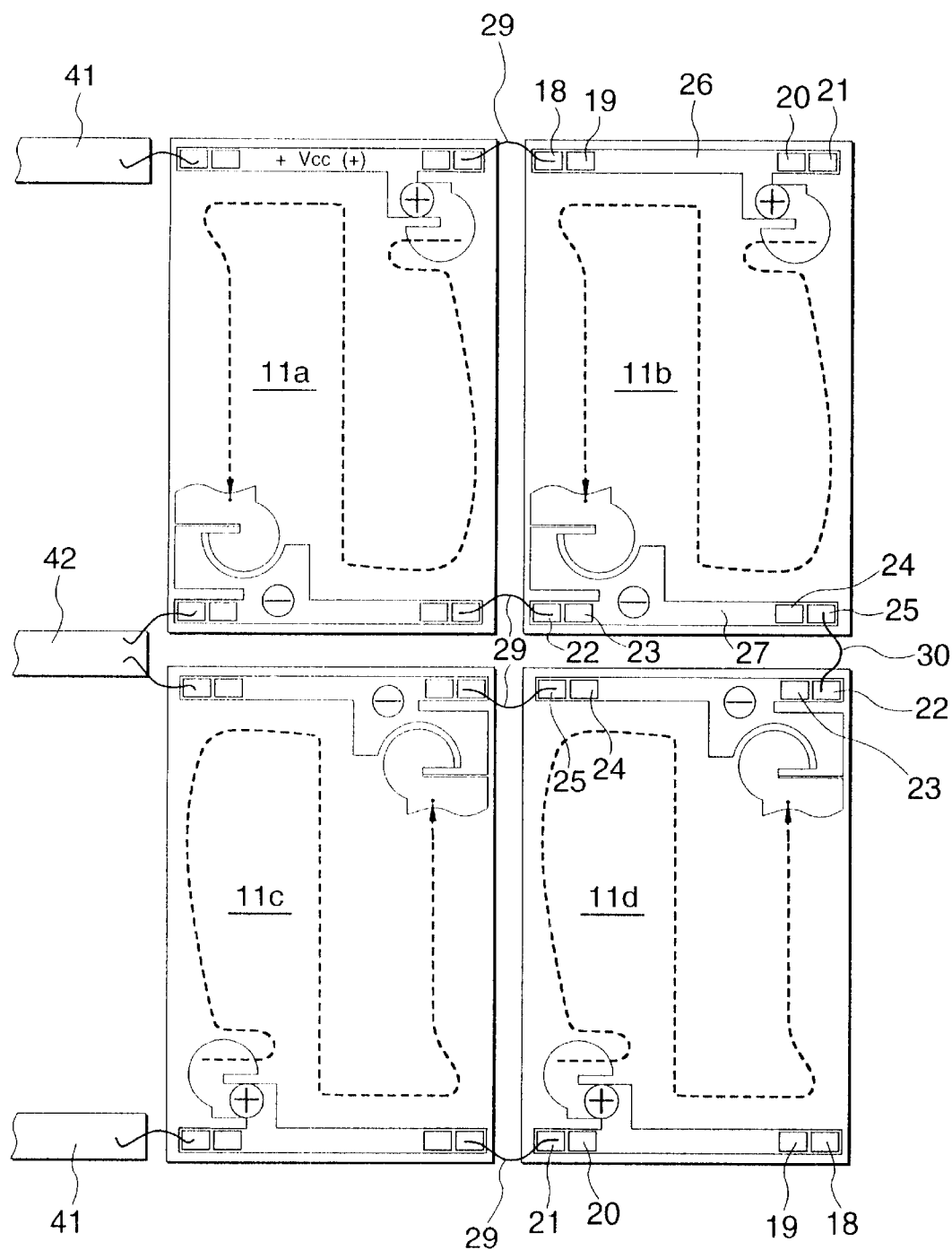
FIG. 5 is a view of a hybrid integrated circuit device of an embodiment of the invention.

As shown in FIG. 5, the hybrid integrated circuit substrates 11 are arranged in a matrix form as described later. Therefore, connection areas 18 to 21 are disposed in both the ends of the first wiring 26, and connection areas 22 to 25 are disposed in both the ends of the second wiring 27. In the case where connecting means 20 and 30 are thin metal wires, these areas are configured as bonding areas, and, in the case where the means are leads which can be fixed by a brazing material, the areas are configured as formation areas for the brazing material.

Alternatively, the Cu pattern on the metal substrate 11 may be realized by bonding a pattern to an insulative flexible sheet, and then bonding the flexible sheet to a hybrid integrated circuit substrate.

The specific structure will be further described with reference to FIG. 6.

As described above, the whole face of the hybrid integrated circuit substrate 11 is covered with the film of the insulative resin 12. In the figure, in addition to the first and second electrodes 15 and 16, island-like reflection electrodes 31 to 36 are disposed. Of course, a countermeasure against a short circuit is taken. Specifically, the electrodes are separated from one another by a predetermined distance. In this case, the driving circuit and/or the protection circuit are not mounted. The two kinds of first and second electrodes 15 and 16 may occupy a substantially whole area of the metal substrate 11 except the circuits and the first and second wirings 26 and 27.

For example, a first electrode 15a or a first electrode 16a may be integrated with the reflection electrode 31. By contrast, the formation of the reflection electrode 31 between the electrodes improves the dielectric properties. An area between these first and second electrodes constitute a slit region SL.

In the first and second electrodes 15 and 16, the surface of Cu is covered with Ni. This is conducted in order to prevent Cu from being oxidized. The light reflection efficiency is lowered by oxidation of Cu. Therefore, Ni or Au which is relatively hardly oxidized, excellent in light reflection property, and glossy is employed in view of also the properties of bonding with respect to a thin metal wire. In the embodiment, Ni is employed from the viewpoint of cost. A substantially whole area of the metal substrate 11 is covered with Ni having substantial glossiness so as to be used as a reflective plate. In the embodiment, Ni is formed on the conductive pattern made of copper, by plating or the like. Alternatively, the conductive pattern itself may be configured by the above-mentioned material. Recently, a brazing material which does not contain lead has been developed. When such a brazing material is used, a metal which has relatively low wettability with respect to the brazing material and which is glossy is selected. In each boding point, a bondable material (Al, Ni, Cu, or Au) may be formed, and other portions may be covered with a material which easily reflects light, such as silver or platinum. In the embodiment, an aluminum wiring is bonded, and hence Ni is employed as the metal covering the surface.

In the case where Ni is employed, the contact resistance with respect to the first electrode 15 is considered. Therefore, Ni corresponding to the region of fixing the land is removed away, and the light emitting diode 10 in the form of a bare chip is electrically fixed to the exposed Cu via a conductive fixing material such as silver paste or solder. In this configuration, also the non-fixing region is covered with Ni, and therefore the reflection efficiency can be further improved. Alternatively, in view of the fixing properties and the chip mounting properties, the whole region of the land may not be covered with Ni.

The light emitting diode 10 is connected to the second electrode 16 via the electrode on the chip surface and the thin metal wire 17. In the case where Al is employed as a thin metal wire, the Al wire can be usually connected to the surface of Ni by a bonding operation based on an ultrasonic wave.

As shown in FIGS. 2 and 4, a light transmitting resin is disposed so as to seal at least the light emitting diode 10. The resin is employed as a lens 37, and formed into a protruding shape so that upward emission from the substrate is efficiently performed. As the material of the lens 37, any resin may be used as far as it is transparent to the emitted light. In the embodiment, a silicone resin, an epoxy resin, or the like is employed. Both the resins are of the heat curing type, and exhibit a low viscosity during a heat curing process. Therefore, the resins cannot be stably formed into a hemisphere shape which is preferably used as a lens. A silicone resin is originally in a liquid state, and its viscosity is not largely changed even during a heat curing process. The viscosity of an epoxy resin is lowered during a heat curing process. Consequently, flow-stopping means 36 is formed so as to surround the light emitting diode 10.

The color of an epoxy resin is gradually changed to yellow by heat. By contrast, the degree of color change in a silicone resin is low. An epoxy resin has excellent wettability. Conversely, a silicone resin has high repellent properties. A cured silicone resin is in a rubber-like or gel state, so that stress exerted on the thin metal wire serving as connecting means for a circuit element is smaller as compared with the case of an epoxy resin.

When a silicone resin is used as the flow-stopping means, a resin (a silicone resin or an epoxy resin) stored inside the means is easily repelled to be formed into a lens-like shape by means of the surface tension. By contrast, when an epoxy resin is used as the flow-stopping means, the resin is hardly formed into a lens-like shape because of high repellent properties. The lens is provisionally cured at about 100 to 150 deg. C, and then again heated at 150 deg. C for one hour to be completely cured.

Depending on the size of the lens, the portion from the middle of the thin metal wire 17 to the portion where the wire is connected to the second electrode 16 is not covered with the resin sealing member, or the whole of the wire is completely covered with the resin. When the wire is completely covered with the resin, also improvement of the reliability of the connecting portion of the thin metal wire can be attained together with that of the light collecting ability.

The lens may be formed into a two-stage shape. This configuration is conducted in order to enhance the directivity of the lens. For attaining the two-stage shape, a silicone resin of low wettability is employed because the lens shape cannot be realized unless the wettability is particularly inferior.

Figure 8:
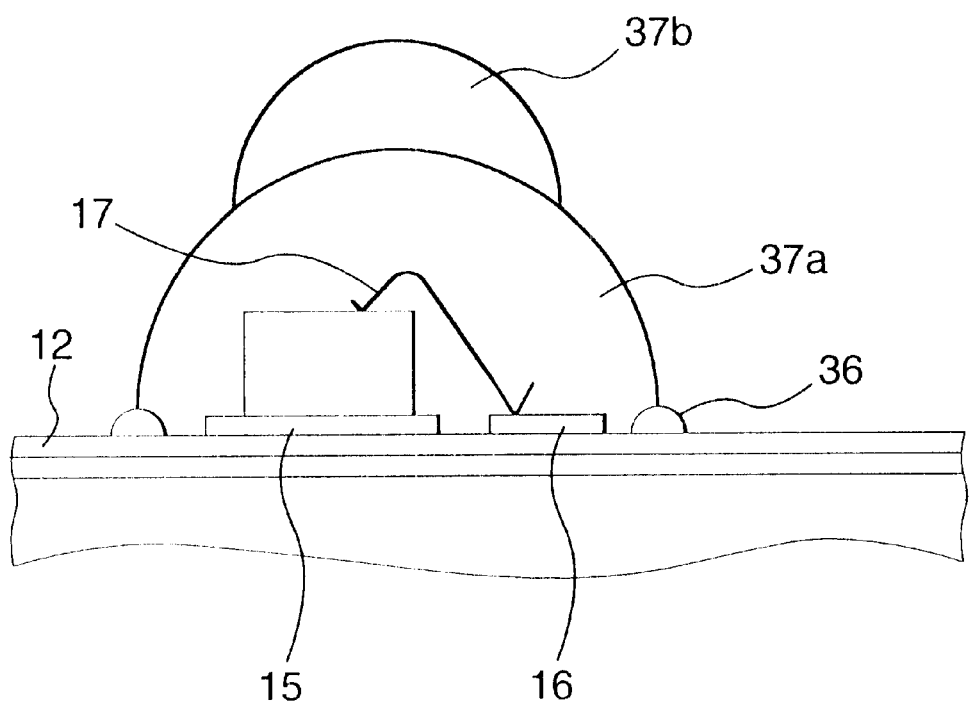
FIG. 8 is a view of a hybrid integrated circuit device of an embodiment of the invention.

As shown in FIG. 8 as an example, the lens may be formed into a two-stage shape. This configuration is conducted in order to enhance the directivity of the lens. For attaining the two-stage shape, a silicone resin of low wettability is employed in both the first and second lenses 37a and 37b because the lens shape of the second lens 37b cannot be realized unless the wettability with respect to the first lens 37a is particularly inferior.

In this case, a silicon resin is protrudingly applied to the flow-stopping means 36 made of a silicone resin. The resin is provisionally cured at about 100 to 150 deg. C for about 30 seconds while maintaining the lens shape. To the resin, a further silicon resin serving as the second lens is applied. Thereafter, provisional curing is performed under the same conditions as those of the previous curing. Finally, the resin is heated at 150 deg. C for one hour to be completely cured.

When the lenses in two stages are configured as described above, the directivity of the emitted light is excellent, and the light emitting efficiency is improved. Since light must pass through both the lenses, it is preferable not to mix a filler into the resin.

Further as the flow-stopping means 36, the brazing material such as solder may be used because of the following reasons. This configuration is superior in light reflection than that in the case where the above-mentioned resin is employed. Furthermore, the brazing material can be formed into a protruding shape.

The embodiment will be specifically described. The embodiment is configured as either of a first type shown in FIGS. 1 and 2, and a second type shown in FIGS. 3 and 4.

Figure 1:
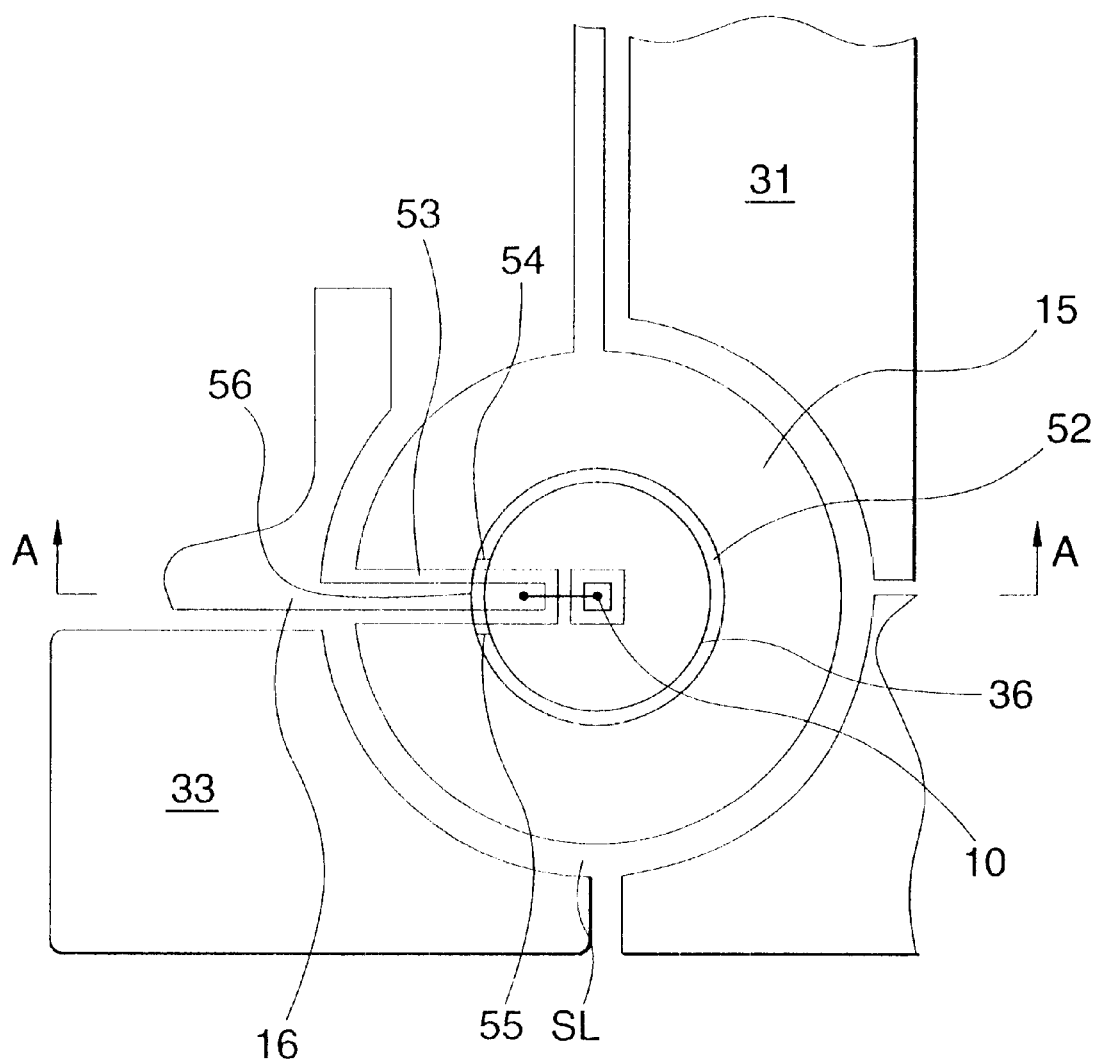
FIG. 1 is a view illustrating a light emitting portion in a hybrid integrated circuit device of an embodiment of the invention.

In the first type, the wettability of Cu with respect to solder, the property that Ni is inferior in wettability with respect to solder than Cu, and the glossiness of the surface of Ni are used. As seen from the figures, in each of the first and second layer 15 and 16, Cu 50 is formed as a lower layer, Ni 51 is formed as an upper layer, and, in a region 52 where the flow-stopping means 36 is to be formed, Ni is removed away. When solder is applied to the region, the solder in the interface between Ni and the solder is repelled because of the inferior wettability of Ni, so that the section is formed into a protruding shape. When solder is formed around the light emitting diode 10 as shown in FIG. 1, the solder surface functions as a reflecting surface, so that light emitted from the light emitting diode can be efficiently directed toward the upper side.

In the first electrode 15, a strip-like removal region 53 (slit region) is formed so as to elongate from the periphery of a circle to the center. The second electrode 16 is insertedly placed in a strip-like manner in the removal region. In this structure, when solder is formed over the whole periphery as shown in FIG. 1, the electrodes 15 and 16 are short-circuited via the solder. Therefore, the first electrode 15 is ended short of reaching the removal region 53. In place of the electrode, an insulative material, or a resin 56 in this example is applied between end portions 54 and 55 as described above. Therefore, a combination of the solder 36 and the resin 56 constitutes the flow-stopping means. A resin which is transparent to light and which will serve as a lens is applied inside the means, and then cured.

Figure 3:
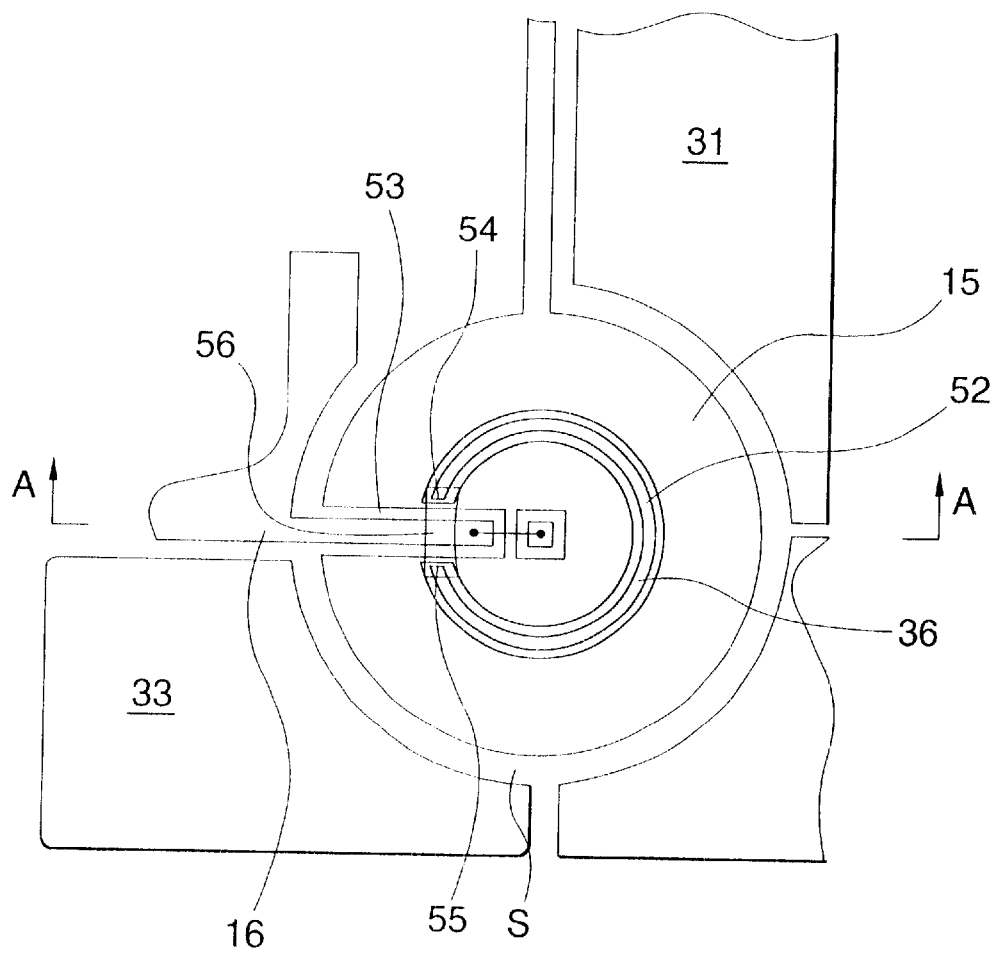
FIG. 3 is a view illustrating a light emitting portion in a hybrid integrated circuit device of an embodiment of the invention.

In the second type, as seen from FIGS. 3 and 4, the region 52 where the flow-stopping means 36 is to be formed is independently formed in an island-like shape inside the first electrode 15. The insulative resin 12 is exposed from the periphery of the region 52. The solder is repelled in the exposed surface. In this example, Ni is removed away. Alternatively, Ni may be formed. As described above, an annular shape must be formed, and hence the resin 56 is applied between the end portions 54 and 55.

The invention is characterized in the flow-stopping means 36 made of a brazing material. The reflection efficiency is enhanced by using the glossiness of the brazing material, so that the amount of irradiation from the hybrid integrated circuit substrate is increased.

Sometimes, a resin film or a so-called solder resist may be formed over the whole face. In this case, when a film which is as glossy as possible is selected, the film can be used as a reflective film in the same manner as Ni. It is a matter of course that the film in the region of fixing the light emitting diode and the connecting portion of the thin metal wire is removed away. When the film is transparent, Ni functions as the main reflective member. When the film is colored, the color of the film is preferably set to white from the viewpoint of reflection efficiency.

Figure 7:
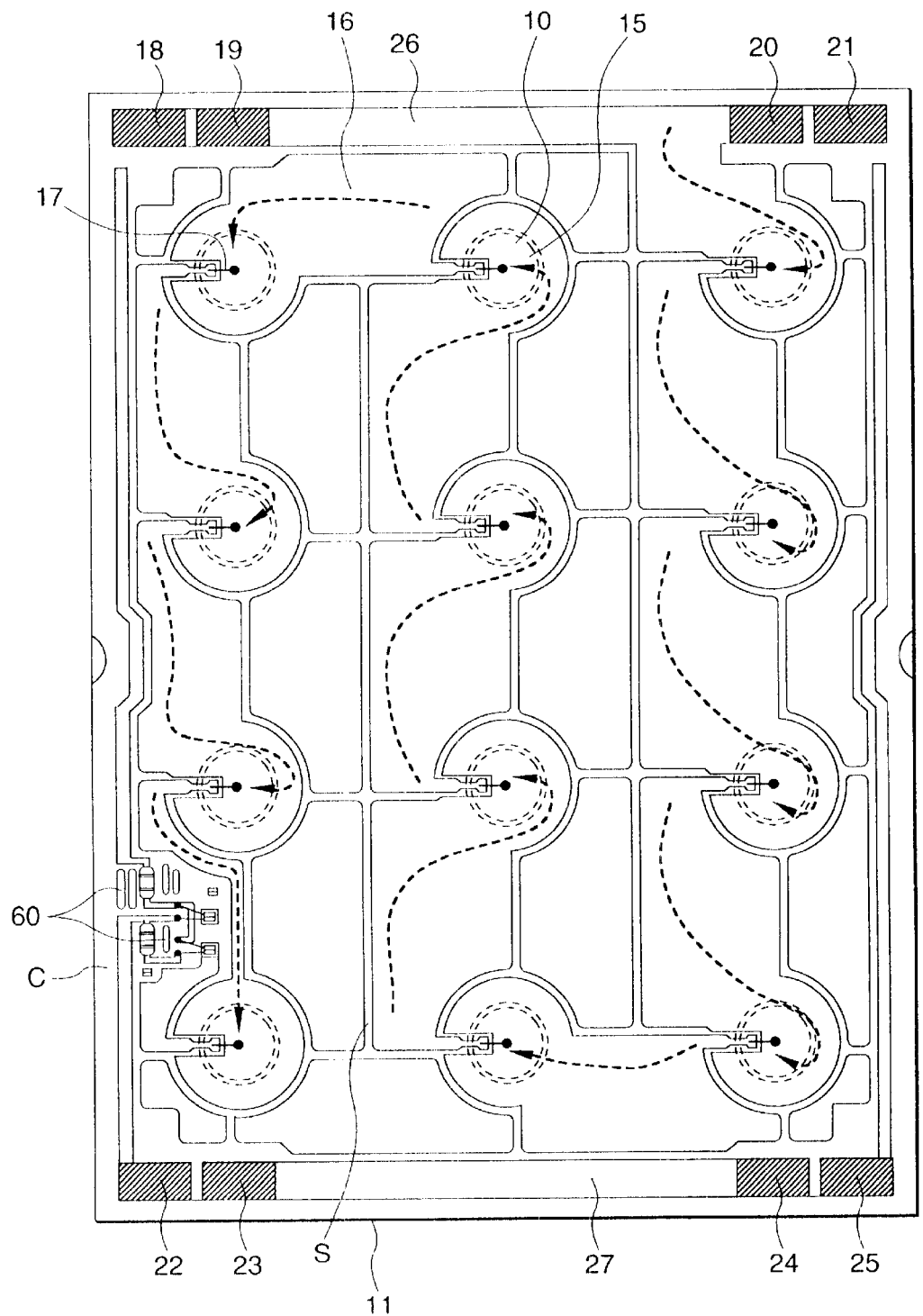
FIG. 7 is a view illustrating a hybrid integrated circuit substrate.

As indicated by the broken line arrows in FIGS. 6 and 7, the light emitting diodes 10 are connected in series between the first and second electrodes 15 and 16.

When the light emitting diodes are connected in parallel, for example, the contact resistances of the thin metal wires 17 and the chips are scattered. Consequently, a current is concentrated on a light emitting diode having a low contact resistance, among the many light emitting diodes 10, thereby causing a problem in that the specific light emitting diode is abnormally bright or finally broken.

To comply with the above, the light emitting diodes 10 are connected in series between the first and second wirings 26 and 27 as shown in FIGS. 6 and 7, so that the currents flowing through the light emitting diodes 10 are constant in level.

In the same manner as the above description, the configurations such as that electrodes are arranged over a substantially whole area of the metal substrate to serve as a reflective plate, that lenses using flow-stopping means of solder are employed, and that Ni in die bonding regions is removed away are employed also in this example.

Referring to FIG. 6, the eleven connection electrodes E2 to E12 are formed between the first and second wirings 26 and 27. Electrodes E1 and E13 are formed integrally with the first and second wirings 26 and 27, respectively, and hence configured as the first and second wirings so as to be distinguished from the connection electrodes.

First, the chip rear face serving as the anode (or the cathode) of the light emitting diode LED1 is fixed to the first electrode E1, and the electrode on the side of the cathode (or the anode) is connected to the second electrode E2 by a thin metal wire 17. The chip rear face of the second light emitting diode LED2 is fixed to the second electrode E2, and the electrode on the chip surface is connected to the third electrode E3 by a thin metal wire. Furthermore, the chip rear face of the third light emitting diode LED3 is fixed to the third electrode E3, and the electrode on the chip surface is connected to the fourth electrode E4 by a thin metal wire. In this way, the light emitting diodes are sequentially connected in series so that the chip rear face of an N-th light emitting diode LED(N) is fixed to an N-th electrode E(N), and finally the electrode on the chip surface is connected to an (N+1)-th electrode E(N+1) by a thin metal wire.

The series connection is realized by repeating the connecting mode. Also in this case, in order to cause the electrodes made of copper foil to serve as reflective plates, the surfaces of the electrodes E1 to E(N+1) are covered with Ni, and, in order to cause the whole area of the substrate to substantially serve as a reflective plate, the patterning is performed so that the substrate is completely covered with the (N+1) electrodes, or, in the case where the substrate is not completely covered with the electrodes, the island-like reflection electrodes 31 to 36 are disposed in open regions. Of course, a small gap is formed so that the electrodes are separated from one another in the pattern. 36 is a flow stopping means made of a ring-shaped insulating resin.

In the structure, the currents flowing through the series-connected light emitting diodes are theoretically equal to one another in level, and hence all the light emitting diodes emit light in the same manner.

When one of the light emitting diodes is broken and no-current flows, all the light emitting diodes stop the light emission.

As shown in FIG. 5, therefore, substrates are connected in parallel between a Vcc line 41 and a GND line 42.

In the case where a light irradiation device is originally to be realized by, for example, 120 (M) light emitting diodes, the light emitting diodes are divided into, for example, 10 (S) sections, 10 (S) metal substrates in each of which 12 (M/S) light emitting diodes are connected in series are prepared, and the substrates are connected in parallel. When a metal substrate of FIG. 7 is employed, a constant current circuit C serving as a protection circuit is disposed, so that the current capacities of all the light emitting diodes can be unified. Also in the case of FIG. 6, a constant current circuit may be employed. In this case, however, the circuit must be externally disposed on the input or output side of the light emitting diodes.

As described above, in each of the plural metal substrates in which the light emitting diodes are connected in series, the current level is determined by the constant current circuit, and hence the brightnesses of all the light emitting diodes are unified. Furthermore, also the brightnesses of the metal substrates are unified. Even when one of the light emitting diodes in any one of the hybrid integrated circuit substrates is broken, the function as an irradiation device can be maintained because the remaining substrates are connected in parallel. It is required to replace only the broken metal substrate with a new one, and hence the repair is requested only to be performed at the minimum degree.

By contrast, as shown in FIG. 5, the wirings 26 and 27 are respectively disposed in the upper and lower sides of the hybrid integrated circuit substrate 11, so as to function as power supply lines. Both the wirings elongate from the left end to the right end. Specifically, in order to laterally connect a plurality of hybrid integrated circuit substrates 11 in parallel, the first and second wirings 26 and 27 elongate from-the right sides of the corresponding hybrid integrated circuit substrate to the left side. As a result, the right end 21 of the first wiring 26 (or the second wiring 27) of a hybrid integrated circuit substrate sa, and the left end 18 of the first wiring 26 (or the second wiring 27) of a hybrid integrated circuit substrate 11b can be connected to each other via the shortest distance. In this example, thin metal wires are used as connecting means 29. Alternatively, the connecting means may be realized by leads which can be fixed by a brazing material such as solder.

If the plural hybrid integrated circuit substrates 11 are realized by a single substrate, a fault due to a breakage of one of the light emitting diodes cannot be repaired, and there arise further problems in that fixation of the connecting means cannot be performed by an automatic machine, and that the fixation requires a production facility of a large scale. In the above case, this problem is raised because of the following reasons. Naturally, the hybrid integrated circuit substrate is large. Therefore, a chip mounter which mounts a chip, and a bonder which performs a die bonding process on a thin metal wire must be realized as machines which have a wide working area. As a hybrid integrated circuit substrate is larger, the thermal capacity of the substrate is greater, and hence the temperature of the substrate itself is more hardly raised. As a result, there arises a problem in that the solderability and the bondability are lowered.

By contrast, in the invention, a parallel connection structure is employed, and the device is configured by plural hybrid integrated circuit substrates. Therefore, the workability of the device is identical with that of the conventional art. Since the hybrid integrated circuit substrates have a small size, the temperature of each substrate can be independently raised, so that the solderability and the bondability are improved.

When the center line is imaginarily placed in the longitudinal direction of each substrate, the first or second wiring 26 or 27 is formed in a bilaterally symmetrical manner.

In the case of the above configuration, advantages are obtained when the substrates are arranged in a matrix form as shown in FIG. 5.

For the sake of simplicity of the figure, a matrix of two rows and two columns will be described. In each of the hybrid integrated circuit substrates 11a and 11b of the first row, the first wiring 26 is placed along the upper side of the substrate, and, in each of the hybrid integrated circuit substrates 11c and 11d of the second row, the first wiring 26 is placed along the lower side. Namely, in order to reduce the total number of the Vcc lines 41 and the GND lines 42, the hybrid integrated circuit substrates are arranged in a 180-deg rotated manner. In FIG. 5, although four lines are originally required, the device can be realized by using three lines.

When the hybrid integrated circuit substrate 11d is rotated, the connection area 22 of the substrate, and the connection area 25 of the hybrid integrated circuit substrate 11b coincide with each other in the direction of the ordinate. This configuration can be realized by forming the substrates so as to be bilaterally symmetrical with respect to the center line.

According to this configuration, the connection area 25 (or the connection area 24) of the hybrid integrated circuit substrate 11b positionally coincides with the connection area 22 (or the connection area 23) of the hybrid integrated circuit substrate 11d, and can be vertically connected to each other by a short distance via the connecting means 30.

This means that the connection area 22 (or the connection area 23) of the hybrid integrated circuit substrate 11b positionally coincides with the connection area 25 (or the connection area 24) of the hybrid integrated circuit substrate 11d, and the areas can be vertically connected to each other via the connecting means 30.

Two connection areas are disposed in each of the ends of the wirings 26 and 27. In this example, this configuration is not particularly necessary because the hybrid integrated circuit substrates 11 are arranged in two rows and two columns. When a larger number of hybrid integrated circuit substrates are arranged in the lateral direction, the connecting means 29 for laterally connecting the substrates is connected to the respective hybrid integrated circuit substrates, but some of the substrates fail to be longitudinally connected to each other via the connecting means 30. In FIG. 5, the wirings are fixed to GND via the connecting means 30. When connection in the longitudinal direction also is made by using surplus areas, the wirings can be fixed to a more stable potential.

The rectangles are shown in the wirings 26 and 27 because, when a thin metal wire is used as connecting means, the copper wirings are covered with Ni, and, when leads are used, the wirings are covered with a brazing material. The rectangles show the covering regions. Namely, the covering regions of a brazing material or Ni are indicated by the connecting means.

In order to set the upper side to Vcc and the lower side to GND, the hybrid integrated circuit substrates 11 are arranged so that an odd number of substrates are placed in the column direction. As seen from FIG. 7, when connection between the first wiring 26 and the second wiring 27 in the lower side is to be made, a simple pattern cannot be attained unless columns each consisting of four light emitting diodes LED1 to LED4 are arranged in an odd number. Also in the case where an even number of columns are arranged, the connection to the second wiring 27 in the lower side is enabled. In this case, however, the end exists on the side of the first wiring 26, and hence an excess wiring for connecting the end to the second wiring is required.

When the hybrid integrated circuit substrates 11 of a relatively small size are arranged in parallel or, as required, in a matrix form as described above, the whole irradiation device can be set to have an arbitrary size. Any shape other than a rectangle may be realized by sequentially arranging such hybrid integrated circuit substrates, and connecting the substrates in parallel.

The invention is characterized also in the region indicated by C in FIG. 7. In the region, the driving circuit and the protection circuit are to be formed. As illustrated, island-like reflection regions 60 are disposed in the open region surrounded by wirings, circuit elements, etc. The region also is covered with a film of a metal which is excellent in reflection property, or Ni in this case.

As seen from the above description, the device-has:
first flow-stopping means which is formed to substantially surround a light emitting element, and which is made of a brazing material; and a light transmitting resin which is protrudingly formed in a region surrounded by the first flow-stopping means, whereby light emitted from the light emitting element can be efficiently reflected by using the glossiness of the surface of the brazing material and the protruding shape of the brazing material. As a result, irradiation of a high efficiency can be realized.

Moreover, a short circuit between the flow-stopping means made of a brazing material and the electrode can be prevented from occurring, by disposing second flow-stopping means made of an insulating material in a portion of the brazing material, the portion overlapping with the first electrode and/or the second electrode.

Furthermore, a Cu film is formed as a lower layer, an Ni film is formed as an upper layer, and a part of the Ni film is removed away to form a Cu exposed region. When solder is formed in the exposed region, the resulting solder upward protrudes. The protruding solder surface forms a reflective plate to efficiently upward reflect light which cannot be upward reflected in the conventional art.

As described above, a hybrid integrated circuit device which emits brighter light can be realized by, particularly, employing flow-stopping means for solder.

As above described, according to the structure, the currents flowing through the series-connected light emitting diodes are equal to one another in level, and hence all the light emitting diodes emit light in the same manner.

When one of the light emitting diodes is broken and no current flows, all the light emitting diodes stop the light emission.

Figure 9:
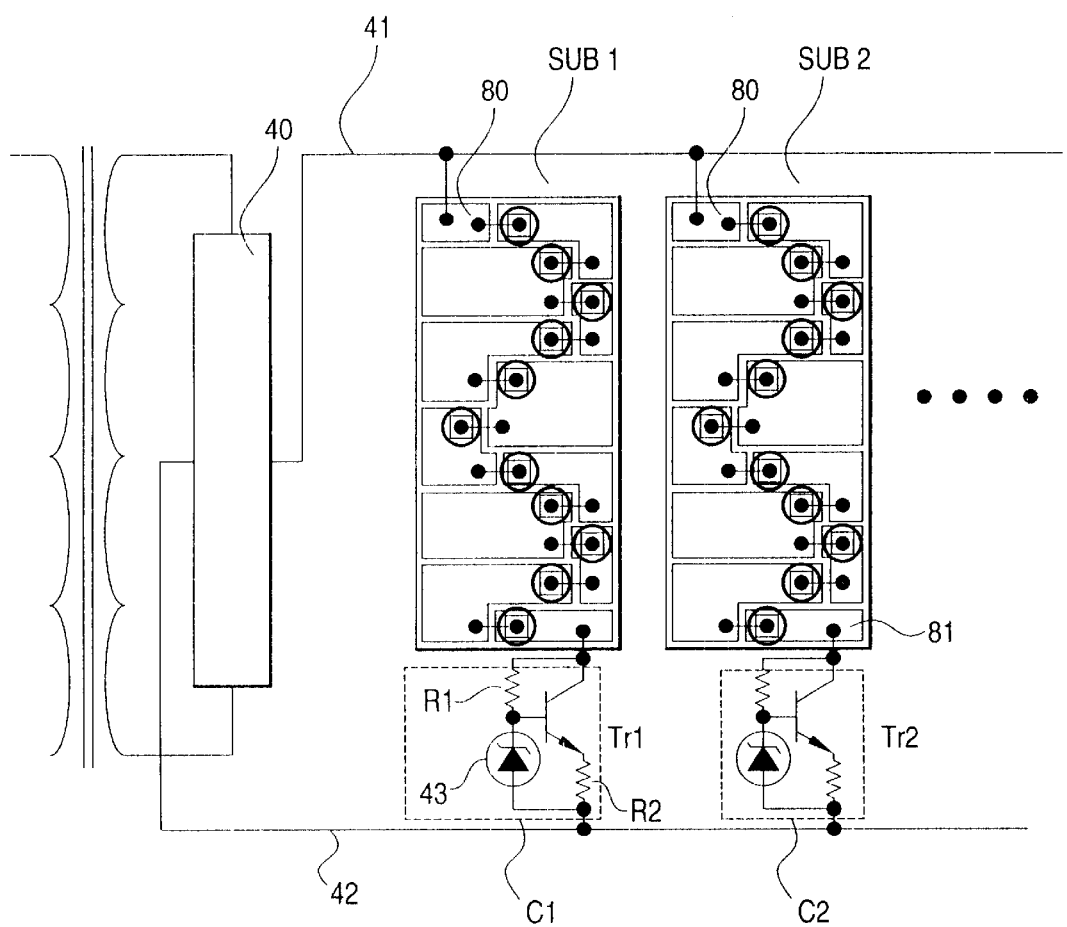
FIG. 9 is a view of a hybrid integrated circuit device of an embodiment of the invention.
Figure 10:
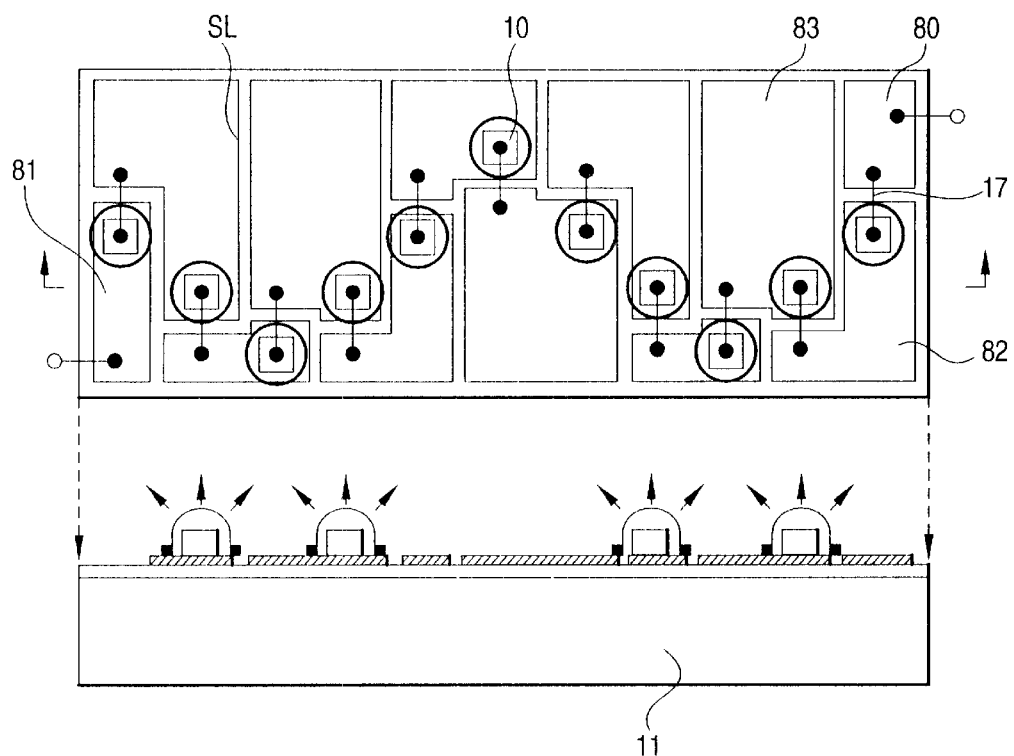
FIG. 10 is a view of a hybrid integrated circuit device of an embodiment of the invention.

Therefore in order to prevent the disadvantage, as shown in FIG. 9, therefore, substrates of FIG. 10 are connected in parallel between a Vcc line 41 and a GND line 42 which elongate from a rectifier circuit 70. A plurality of substrates SUB1, SUB2, . . . on each of which series-connected light emitting diodes are mounted are mounted on another metal substrate or a mounting substrate of another kind, and constant current circuits C1, C2, . . . are disposed for the substrates SUB1, SUB2, . . . respectively.

The constant current circuits should be considered as an example, and circuits of another kind may be used. Referring to the figure, the collector of a transistor Tr1 is connected to the electrode 81, and the emitter is connected to the GND line 42 via a resistor R2. A resistor R1 is connected between the collector and the base of the transistor Tr1. A Zener diode 43 is connected between the base and the GND line 42.

From the relational expression $$Vz = VBE + I*R2,$$

a current I which flows from the Vcc line to pass through the substrate SUB1 is given by $$I = (Vz - VBE)/R2.$$

Alternatively, each constant current circuit may be connected between the Vcc line 41 and the electrode 80. The constant current circuits C1, C2, . . . may be externally mounted, or on the respective substrates.

As described above, in the metal substrates SUB1, SUB2, . . . in each of which light emitting diodes are connected in series, the current level is determined by the constant current circuit, and hence the brightnesses of all the light emitting diodes in the substrates SUB1, SUB2, . . . are unified. Even when one of the light emitting diodes in the substrate SUB1 is broken, the function as an irradiation device can be maintained because the remaining substrates SUB2, . . . are connected in parallel.

Figure 11:
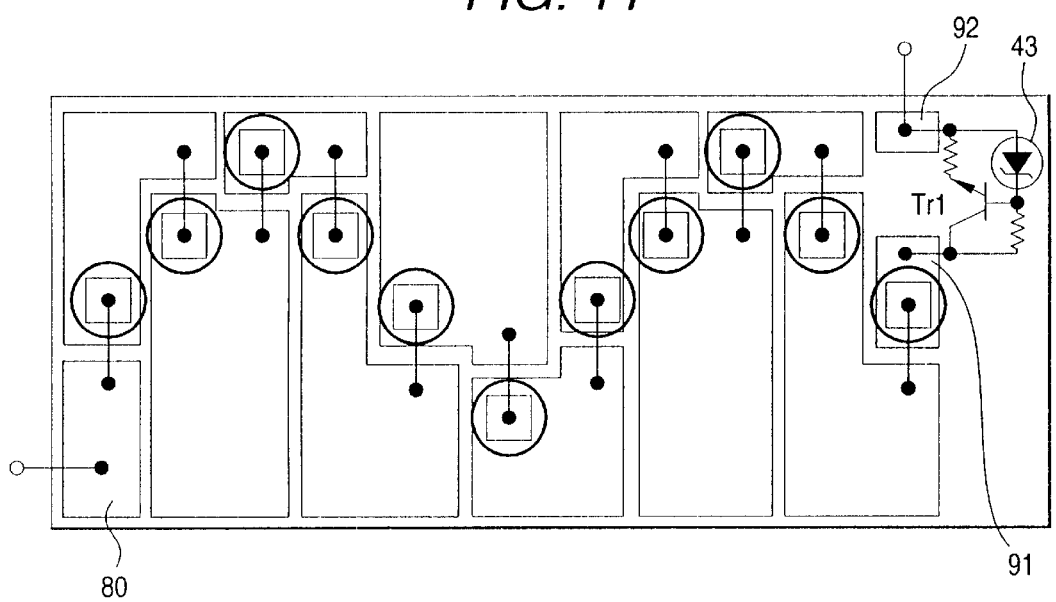
FIG. 11 is a view of a hybrid integrated circuit device of an embodiment of the invention.

FIG. 11 shows, although schematically, an example in which the constant current circuit is mounted on a metal substrate. The electrode 81 of FIG. 9 is divided into two electrodes 91 and 92, a wiring pattern which is required for the constant current circuit is formed between the electrodes, and necessary elements are mounted. In view of the mounting efficiency and heat radiation properties, the transistor Tr1 and the Zener diode 43 are preferably mounted in the form of a bare chip. The resistors may be realized by chip resistors or printed resistors. It is a matter of course that the constant current circuit may be mounted on the side of the electrode 80.

The constant current circuit may be incorporated into the parallel circuit. In this case, the constant current circuit must be formed for each of the light emitting diodes. This is disadvantageous in respects of the enlarged size of the metal substrate and the production cost.

Next, properties of a lens which is formed as a result of solidification of a transparent fluid resin will be described with reference to FIG. 12.

FIG. 12 shows measured values of an amount of light (mW) of samples in which a lens is not formed, and those in which a lens is formed in either of one to three stages, as starting from the left side. The transparent resin configuring each lens is a silicone resin. In the formation, the resin is applied at an air pressure of 1.5 kgf/cm, and ejected during 1.3 sec. for the first stage, during 0.3 sec. for the second stage, and during 0.1 sec. for the third stage. The amount of light is measured under the following conditions, namely, the measuring device is Optical sensor MA9422A produced by Anritsu Corporation, the measurement wavelength is 633 nm, and the measurement current is 50 mA.

In a state where a lens was not formed, the average amount of light was 2.22 mW, and, when the lens stage was sequentially changed from one stage to three stages, the increasing rates were 180%, 185%, and 205%. Therefore, it will be seen that the amount of light is increased by disposing at least one stage of lens.

Figure 13:
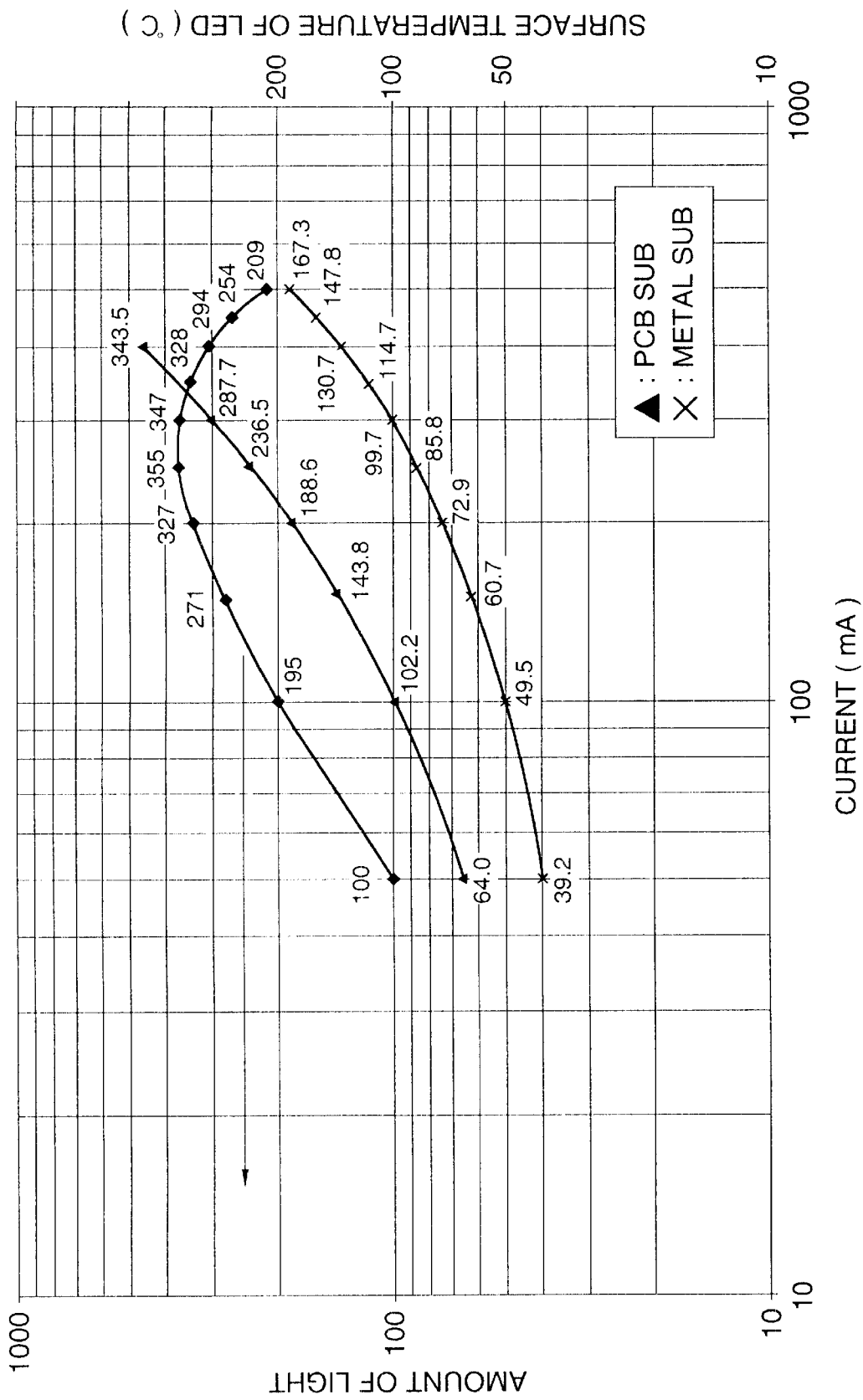
FIG. 13 is a view showing a relation ship between a substrate material and a light quantity.

Next, the reason of using a metal substrate will be described with reference to FIG. 13.

The Y-axis on the left side indicates the amount of light. The amount of light is calculated while the amount of light which is obtained when a current of 50 mA flows through a light emitting diode is set to 100. The Y-axis on the right side indicates the surface temperature (deg. C) of a light emitting diode. The X-axis indicates the current (mA) flowing through a light emitting diode. The curve indicated by triangles shows the surface temperature of a light emitting diode mounted on a printed circuit board, that indicated by crosses shows the surface temperature of a light emitting diode mounted on a metal substrate, and that indicated by rhombi shows the amount of light of a light emitting diode mounted on a metal substrate. Here initial value is considered to 100 and a relation ship between a surface temperature a light amount and a current amount.

From these curves, it will be seen that, when the surface temperature of a light emitting diode is higher than about 80 to 100 deg. C, the amount of light is not increased by increasing the driving current, but on the contrary decreased. In other words, when the driving current is increased so as to exceed a level at which the surface temperature is attained, the loss is increased by the increased current, thereby lowering the efficiency. Therefore, a light emitting diode must be driven by a driving current the level of which is lower than the level at which the temperature is attained. Furthermore, it will be seen that the maximum brightness is realized by a driving current at the surface temperature of about 80 to 100 deg. C.

It will be further seen that, when a current of about 250 mA flows, the surface temperature of the light emitting diode on the printed circuit board reaches about 236 deg. C, and that of the light emitting diode on the metal substrate is as low as 85.8 deg. C. When a metal substrate is employed, therefore, the surface temperature of a light emitting diode can be largely lowered. In accordance with the lowering, the driving current of the light emitting diode can be increased, and at the same time the amount of light emitted from the light emitting diode can be enhanced. Therefore, the invention is characterized in that, when a metal substrate is employed and a lens is further employed, the amount of light can be increased.

As seen from the-above description, the amount of irradiation of a light irradiation device can be increased by employing a metal substrate, and can be further increased by employing a lens.

Since a light emitting diode in the form of a bare chip is mounted on a metal substrate, the heat radiation properties through the metal substrate is improved, so that the temperature rise of the light emitting diode itself can be suppressed. Therefore, a current of a higher level can be supplied, and the brightness as a light irradiation device can be improved.

Since an electrode which reflects light is formed on a metal substrate, light emitted from side and rear faces of a light emitting diode can be reflected by the electrode. When a material such as Ni or Au which has excellent corrosion resistance is formed on a Cu foil pattern, particularly, improvements of the bondability with respect to a thin metal wire, and the reflection efficiency can be simultaneously realized.

When flow-stopping means is disposed, a lens can be formed by applying a transparent resin, so that the efficiency of upward emission can be further enhanced.

In a region of fixing a light emitting diode, the contact resistance can be lowered by removing Ni, thereby enabling a current of a higher level to flow.

Figure 14:
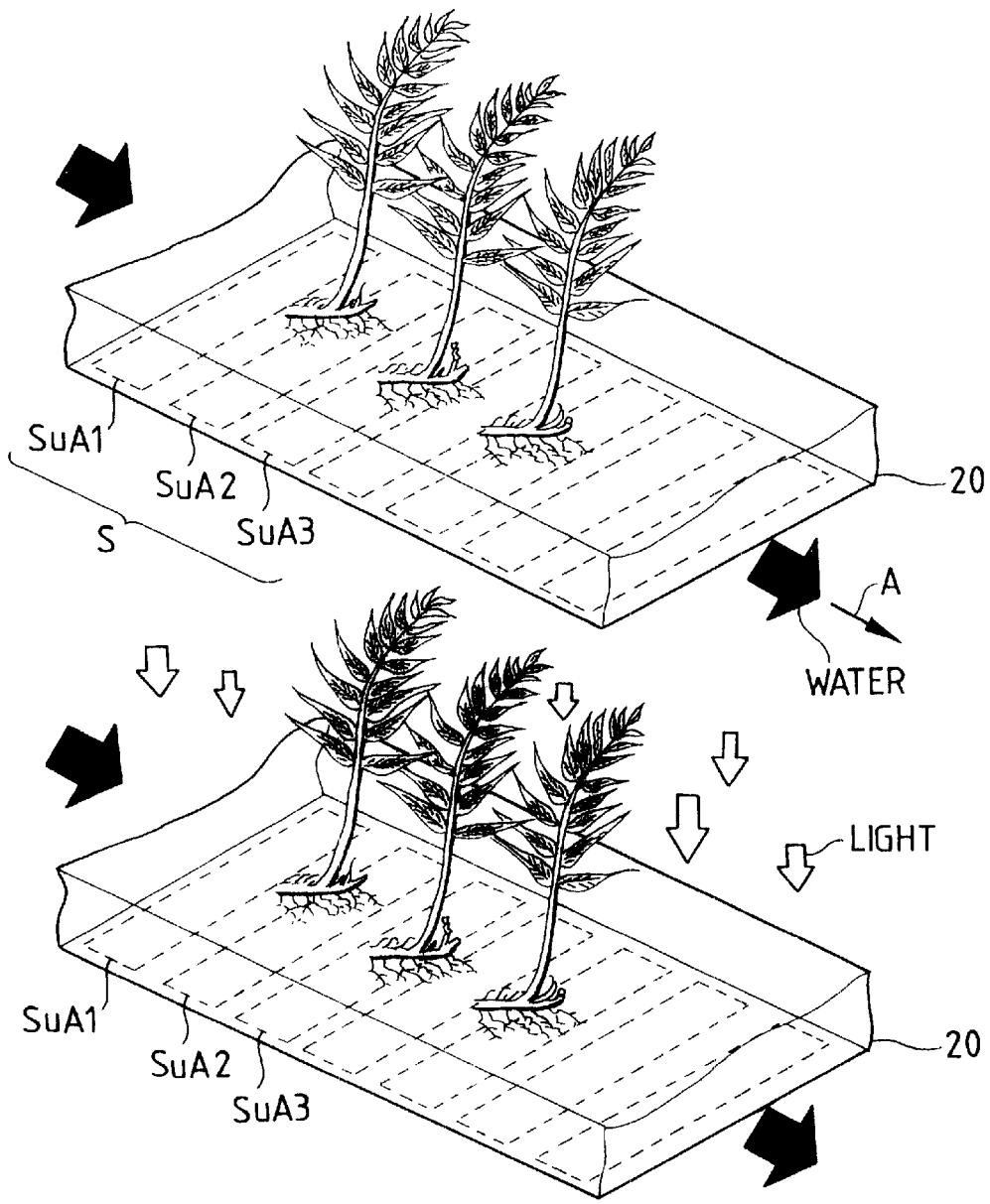
FIG. 14 is a view of a hybrid integrated circuit device of an embodiment of the invention.
Figure 15:
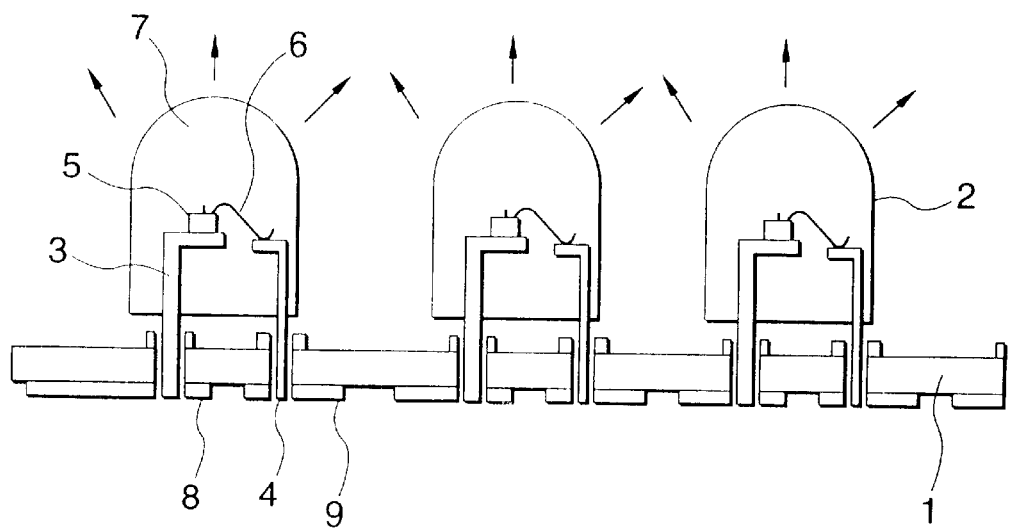
FIG. 15 is a view illustrating an irradiation device of the conventional art.

Further as shown in FIG. 14 these hybrid integrated circuit device is used as a light irradiating apparatus for growing a vegetable or fruit such as lettuce or melon, flower and so on. These light irradiating apparatus is constituted by a metallic container 20 filled with water for growing a plant, and a hybrid integrated circuit device S fixed on a rear face of the container 20. The hybrid integrated circuit device S is constituted by arrangement of the hybrid integrated circuit device SuA1, SuA2, SuA3 . . . SuB1, SuB2, SuB3 . . . each of them is as same as shown in FIG. 3.

A light generated by the light emitting diodes is irradiated to the plants P effectively and water in the container 20 is used as a cooling water for absorbing a heat generated by the light emitting diodes and other circuits and suppressing a temperature increase of the light emitting diodes.

According to the apparatus, efficient plant growth can be obtained.

What is claimed is:

1. A hybrid integrated circuit device comprising:
   first and second electrodes formed on a substrate;
   a light emitting element in which a rear face of said element is electrically fixed to said first electrode:
   connecting means for electrically connecting said second electrode to an electrode on a surface of said light emitting element;
   a flow-stopping means formed to substantially surround said light emitting element; and
   a light transmitting resin disposed over the light emitting element and within a region surrounded by said flow-stopping means,
   wherein the flow-stopping means comprises a first flow-stopping means made of a brazing material and a second flow-stopping means made of an insulating material is disposed in a portion of said brazing material, said portion overlapping with said first electrode and/or said second electrode.

2. A hybrid integrated circuit device according to claim 1, wherein said flow-stopping means is a ring made of an insulating resin.

3. A hybrid integrated circuit device according to claim 1, wherein the second flow-stopping means is made of epoxy resin, and the light transmitting resin is made of silicone resin.

4. A hybrid integrated circuit device according to claim 1, wherein the first and second electrodes are made of reflective material.

5. A hybrid integrated circuit device according to claim 1, wherein the first and second electrodes are made of nickel.

6. A hybrid integrated circuit device according to claim 1, further comprising a solder resist layer formed so as to cover the first and second electrodes.

7. A hybrid integrated circuit device according to claim 1, wherein said substrate is made of a metal substrate whose surface is insulated.

8. A circuit device comprising:
   a substrate;
   a first wiring region of a reflective conductive film at one end of the substrate;
   a second wiring region at the other end of the substrate; and
   a plurality of the hybrid integrated circuit devices of claim 1 connected in series,
   wherein the first wiring region, the hybrid integrated circuit devices of claim 1, and the second wiring region are connected in series.

9. A hybrid integrated circuit device comprising:
   first and second electrodes insulatedly formed on a hybrid integrated circuit substrate made of Cu;
   a light emitting element in which a rear face of said element is electrically fixed to said first electrode;
   connecting means for electrically connecting said second electrode to an electrode on a surface of said light emitting element;
   first flow-stopping means which is formed around said light emitting element; and
   a light transmitting resin protrudingly disposed over the light emitting element and within a region surrounded by said first flow-stopping means,
   a metal film covers said first electrode and/or said second electrode, said metal film being inferior in wettability with respect to a brazing material and superior in light reflection than the Cu:
   a portion of said metal film corresponding to said first electrode and/or said second electrode and in a region where said first flow-stopping means is disposed is removed away, and a brazing material is formed in said region.

10. A hybrid integrated circuit device according to claim 1, wherein said first electrode is formed in an annular shape to substantially surround said second electrode, and said brazing material is formed on said first electrode in a substantially annular shape.

11. A hybrid integrated circuit device according to claim 1, wherein said first electrode is formed in an annular shape to substantially surround said second electrode, and said region where said brazing material is formed is formed in a substantially island-like shape in said first electrode.

12. A hybrid integrated circuit device, comprising:

first and second electrodes insulatedly formed on a hybrid integrated circuit substrate made of Cu;

a light emitting element in which a rear face of said element is electrically fixed to said first electrode;

connecting means for electrically connecting said second electrode to an electrode on a surface of said light emitting element;

first flow-stopping means which is formed around said light emitting element; and a light transmitting resin protrudingly disposed over the light emitting element and within a region surrounded by said first flow-stopping means, a metal film covers said first electrode and/or said second electrode, said metal film being inferior in wettability with respect to a brazing material and superior in light reflection than the Cu;

a portion of said metal film corresponding to said first electrode and/or said second electrode and in a region where said first flow-stopping means is disposed is removed away, and a brazing material is formed in said region, wherein said metal film is made of Ni.

13. A circuit device, comprising:

a plurality of said hybrid integrated circuit devices of claim 1 connected in series.

14. A hybrid integrated circuit device according to claim 1, wherein the light transmitting resin has a two stage structure to introduce a light emitted by the light emitting elements into a front direction.

15. A hybrid integrated circuit device according to claim 1, wherein said flow-stopping means upwardly reflects light emitted from said light emitting element.

* * * * *